US012682817B2

(12) United States Patent
Tseng et al.

(10) Patent No.: US 12,682,817 B2
(45) Date of Patent: Jul. 14, 2026

(54) SCAN DRIVING CIRCUIT AND DISPLAY PANEL

(71) Applicant: Everdisplay Optronics (Shanghai) Co., Ltd., Shanghai (CN)

(72) Inventors: Ying-Hsiang Tseng, Shanghai (CN); Lina Xiao, Shanghai (CN); Qi Wang, Shanghai (CN); Jie Liu, Shanghai (CN)

(73) Assignee: Everdisplay Optronics (Shanghai) Co., Ltd., Shanghai (CN)

( * ) Notice: Subject to any disclaimer, the term of this patent is extended or adjusted under 35 U.S.C. 154(b) by 277 days.

(21) Appl. No.: 18/709,827

(22) PCT Filed: Oct. 31, 2023

(86) PCT No.: PCT/CN2023/128624

§ 371 (c)(1),
(2) Date: May 14, 2024

(87) PCT Pub. No.: WO2025/035611

PCT Pub. Date: Feb. 20, 2025

(65) Prior Publication Data

US 2026/0162585 A1 Jun. 11, 2026

(30) Foreign Application Priority Data

Aug. 17, 2023 (CN) .......................... 202311042672.4

(51) Int. Cl.
*G09G 3/20* (2006.01)
*G11C 19/18* (2006.01)

(52) U.S. Cl.
CPC ......... *G09G 3/2092* (2013.01); *G11C 19/184* (2013.01); *G11C 19/188* (2013.01); *G09G 2310/0286* (2013.01); *G09G 2310/067* (2013.01); *G09G 2310/08* (2013.01)

(58) Field of Classification Search
None
See application file for complete search history.

(56) References Cited

U.S. PATENT DOCUMENTS 10,019,930 B2 7/2018 Tseng
2017/0124936 A1 * 5/2017 Tseng .................. G09G 3/3266
(Continued)

FOREIGN PATENT DOCUMENTS

CN 106652867 A 5/2017
CN 106910453 A 6/2017
CN 107025872 A 8/2017
(Continued)

OTHER PUBLICATIONS

International Search Report dated Dec. 11, 2023 of International Application No. PCT/CN2023/128624.
(Continued)

*Primary Examiner* — Christopher J Kohlman
(74) *Attorney, Agent, or Firm* — Qinghong Xu

(57) ABSTRACT

The present disclosure relates to the field of display panels and provides a scan driving circuit and a display panel. The scan driving circuit includes multiple stages of shift register units and a timing controller. Each stage of shift register unit includes 10 or 11 transistors and 2 capacitors. The timing controller includes three timing control signal lines.

20 Claims, 8 Drawing Sheets

(56)        References Cited

U.S. PATENT DOCUMENTS

| | | |
|---|---|---|
| 2018/0091151 A1 | 3/2018 | Zheng et al. |
| 2021/0358362 A1 | 11/2021 | Zhang |

FOREIGN PATENT DOCUMENTS

| | | |
|---|---|---|
| CN | 108346405 A | 7/2018 |
| CN | 208141796 U | 11/2018 |
| CN | 110364108 A | 10/2019 |
| CN | 114519975 A | 5/2022 |
| CN | 114842901 A | 8/2022 |
| CN | 115035863 A | 9/2022 |
| KR | 20060129881 A | 12/2006 |

OTHER PUBLICATIONS

1st Office Action dated Jan. 17, 2024 for Chinese Application No. 202311042672.4.

\* cited by examiner

SCAN DRIVING CIRCUIT AND DISPLAY PANEL

CROSS REFERENCE TO RELATED APPLICATION

The present application is a U.S. National Stage of International Application No. PCT/CN2023/128624, filed on Oct. 31, 2023, which claims the benefit of priority to Chinese Application No. 202311042672.4, filed on Aug. 17, 2023, both of which are incorporated by reference herein in their entireties for all purposes.

TECHNICAL FIELD

The present disclosure relates to the field of display panels, and in particular, to a scan driving circuit and a display panel.

BACKGROUND

The display panel includes a pixel array, as well as a scan driving circuit and a light-emitting driving circuit that control the pixel array. The display panel adopts progressive scanning display method, in which the scan driving circuit is configured to generate scan signals to activate pixels in each row in sequence.

The scan driving circuit includes a plurality of cascaded shift register units. The circuit of each shift register unit is usually mainly composed of several transistors. By inputting a clock signal and a start pulse signal to the circuit, scan signals are output at the output terminal.

US patent U.S. Ser. No. 10/019,930B2 provides a scanning circuit. FIG. 1 shows a circuit diagram of a shift register unit in the prior art. As shown in FIG. 1, in this circuit, due to the small number of components in the circuit, and the fact that the node N1' is not always held high by a voltage source to turn off T8' when the output terminal VOUT outputs a high level, the circuit is less tolerant and less reliable in the event of fluctuation in the manufacturing process of the display panel, noise from the IC power supply signals, prolonged operation, etc.

It should be noted that the information disclosed in the above background section is only used to enhance understanding of the background of the present disclosure, and therefore may include information that does not constitute prior art known to those of ordinary skill in the art.

SUMMARY

According to an aspect of the present disclosure, there is provided a scan driving circuit, including multiple stages of shift register units, where each of the shift register units includes:

a first transistor, where a first electrode of the first transistor is connected to a third node, a second electrode of the first transistor is connected to a signal input terminal, and a gate electrode of the first transistor is connected to a third timing control terminal;

a second transistor, where a first electrode of the second transistor is connected to a first power supply, a second electrode of the second transistor is connected to the third node, and a gate electrode of the second transistor is connected to a first timing control terminal;

a third transistor, where a first electrode of the third transistor is connected to the third timing control terminal, a second electrode of the third transistor is connected to a first node, and a gate electrode of the third transistor is connected to the third node;

a fourth transistor, where a first electrode of the fourth transistor is connected to the third node, a second electrode of the fourth transistor is connected to a second node, and a gate electrode of the fourth transistor is connected to a second power supply;

a fifth transistor, where a first electrode of the fifth transistor is connected to the first power supply, and a gate electrode of the fifth transistor is connected to a second timing control terminal;

a sixth transistor, where a first electrode of the sixth transistor is connected to the second electrode of the fifth transistor, a second electrode of the sixth transistor is connected to the second node, and a gate electrode of the sixth transistor is connected to the first node;

a seventh transistor, where a second electrode of the seventh transistor is connected to the second power supply, and a gate electrode of the seventh transistor is connected to the first timing control terminal;

an eighth transistor, where a first electrode of the eighth transistor is connected to the first node, a second electrode of the eighth transistor is connected to the second power supply, and a gate electrode of the eighth transistor is connected to the third timing control terminal;

a ninth transistor, wherein a first electrode of the ninth transistor is connected to the first power supply, a second electrode of the ninth transistor is connected to a signal output terminal, and a gate electrode of the ninth transistor is connected to the first node;

a tenth transistor, where a first electrode of the tenth transistor is connected to the signal output terminal, a second electrode of the tenth transistor is connected to the second timing control terminal, and a gate electrode of the tenth transistor is connected to the second node;

a first capacitor, where a first electrode of the first capacitor is connected to the first power supply, and a second electrode of the first capacitor is connected to the first node; and a second capacitor, where a first electrode of the second capacitor is connected to the second node, and a second electrode of the second capacitor is connected to the signal output terminal.

In some embodiments, the first electrode of the seventh transistor is connected to the first node.

In some embodiments, the shift register unit further includes:

an eleventh transistor, where a first electrode of the eleventh transistor is connected to the first node, a second electrode of the eleventh transistor is connected to the first electrode of the seventh transistor, and a gate electrode of the eleventh transistor is connected to the first node.

In some embodiments, the scan driving circuit further includes a timing controller, where the timing controller includes a first timing control signal line, a second timing control signal line and a third timing control signal line.

In some embodiments, the first timing control signal line is configured to output a first timing control signal; the second timing control signal line is configured to output a second timing control signal; and the third timing control signal line is configured to output a third timing control signal.

In some embodiments, the first timing control signal, the second timing control signal and the third timing control signal are square wave signals with same output frequency and a continuous low potential occupying ⅓ of a period.

In some embodiments, the shift register unit is configured to perform a delay processing on a signal received from the signal input terminal under control of the first timing control signal, the second timing control signal and the third timing control signal, and a processed signal is output by the signal output terminal.

In some embodiments, the shift register unit at a previous stage outputs a scan signal to the shift register unit at a next stage, and the shift register unit at a last stage outputs a scan signal.

In some embodiments, in a (3N-2)-th stage shift register unit, the first timing control terminal is connected to the first timing control signal line, the second timing control terminal is connected to the second timing control signal line, and the third timing control terminal is connected to the third timing control signal line, where N is a positive integer.

In some embodiments, in a (3N-1)-th stage shift register unit, the first timing control terminal is connected to the third timing control signal line, the second timing control terminal is connected to the first timing control signal line, and the third timing control terminal is connected to the second timing control signal line, where N is a positive integer.

In some embodiments, in a 3N-th stage shift register unit, the first timing control terminal is connected to the second timing control signal line, the second timing control terminal is connected to the third timing control signal line, and the third timing control terminal is connected to the first timing control signal line, where N is a positive integer.

In some embodiments, the first transistor to the eleventh transistor are all P-type MOS transistors.

According to another aspect of the present disclosure, there is provided a display panel, including the scan driving circuit according to any one of the above items.

It should be understood that the above general description and the detailed description hereinafter are merely exemplary and explanatory and do not limit the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure. For those of ordinary skill in the art, other drawings can be obtained based on these drawings without exerting creative efforts.

Figure 1:
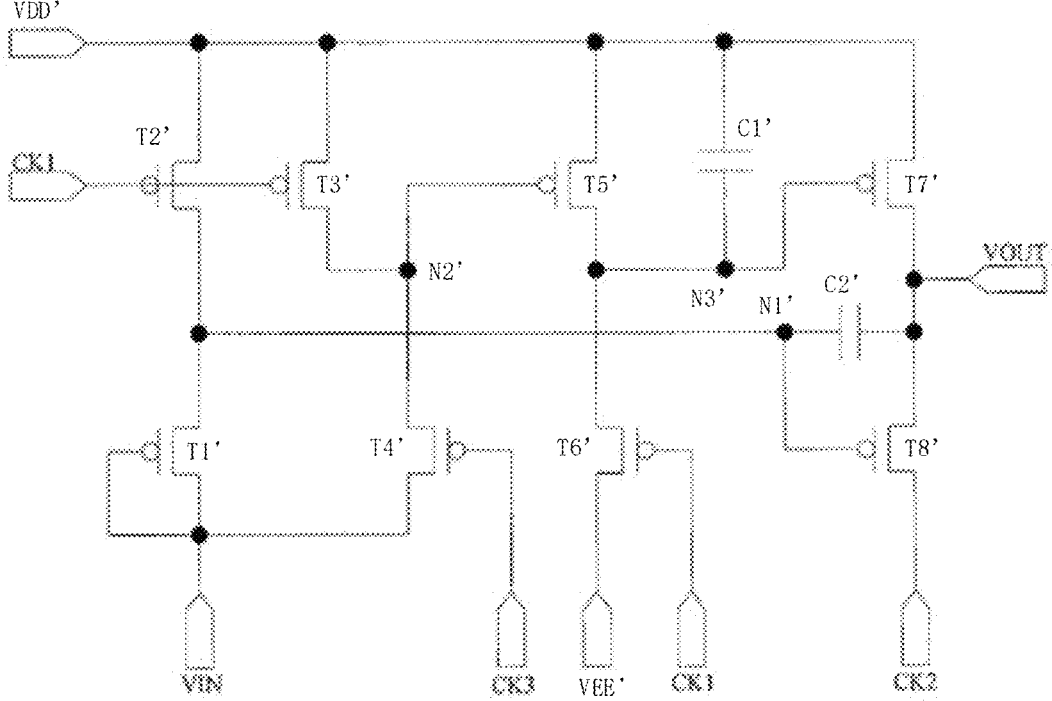
FIG. 1 shows a circuit diagram of a shift register unit in prior art.

REFERENCE NUMERALS 10 display panel
11 display area
20 timing controller
30 scan driving circuit
CKV1 first timing control signal line
CKV2 second timing control signal line
CKV3 third timing control signal line
c1 first timing control terminal
c2 second timing control terminal
c3 third timing control terminal
IN signal input terminal
Gout signal output terminal
T1 first transistor
T2 second transistor
T3 third transistor
T4 fourth transistor
T5 fifth transistor
T6 sixth transistor
T7 seventh transistor
T8 eighth transistor
T9 ninth transistor
T10 tenth transistor
T11 eleventh transistor
C1 first capacitor
C2 second capacitor
VDD first power supply
VEE second power supply
N1 first node
N2 second node
N3 third node

DETAILED DESCRIPTION

Example embodiments will now be described more fully with reference to the accompanying drawings. Example embodiments may, however, be embodied in various forms and should not be construed as limited to the embodiments set forth herein. Rather, these embodiments are provided so that the present disclosure will be thorough and complete, and will fully convey the concept of example embodiments to those skilled in the art. The same reference numerals in the drawings represent the same or similar structures, and thus their repeated description will be omitted.

The use of "first", "second" and similar words in specific descriptions does not imply any order, quantity or importance, but is only used to distinguish different components. In addition, in the description of the present disclosure, the orientation or positional relationship indicated by the terms "upper", "lower", etc. is based on the orientation or positional relationship shown in the drawings. It is only for convenience of description and does not indicate or imply that the devices or elements must have a specific orientation, and must be constructed and operated in a specific orientation, and therefore are not to be construed as limitations of the present disclosure.

It should be noted that, as long as there is no conflict, features in different embodiments of the present disclosure can be combined with each other.

Figure 3:
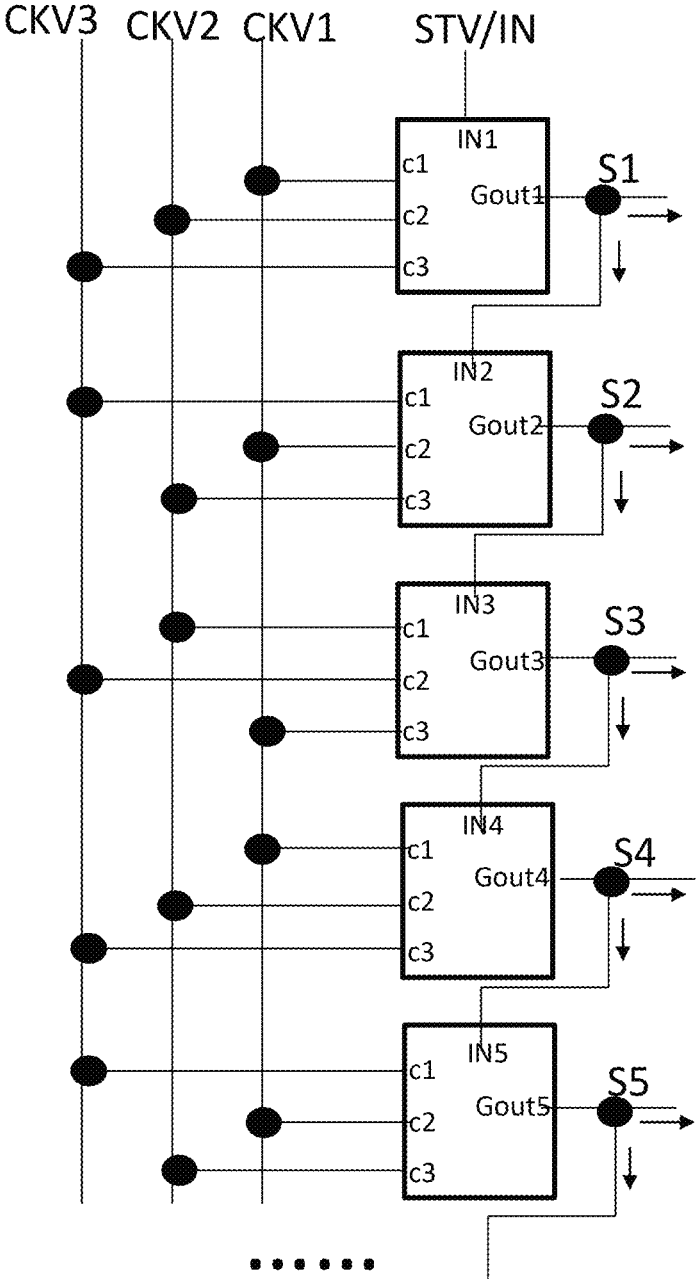
FIG. 3 shows a cascade schematic diagram of the scan driving circuit of the present disclosure.
Figure 4:
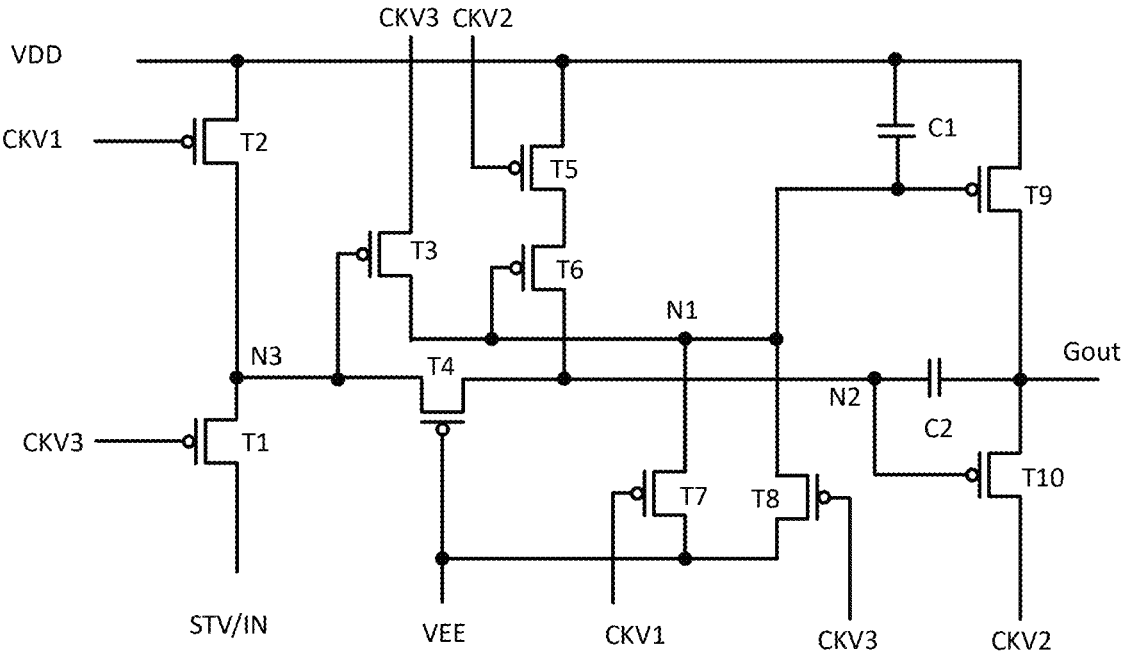
FIG. 4 shows a circuit diagram of a shift register unit according to a first embodiment of the present disclosure.
Figure 12:
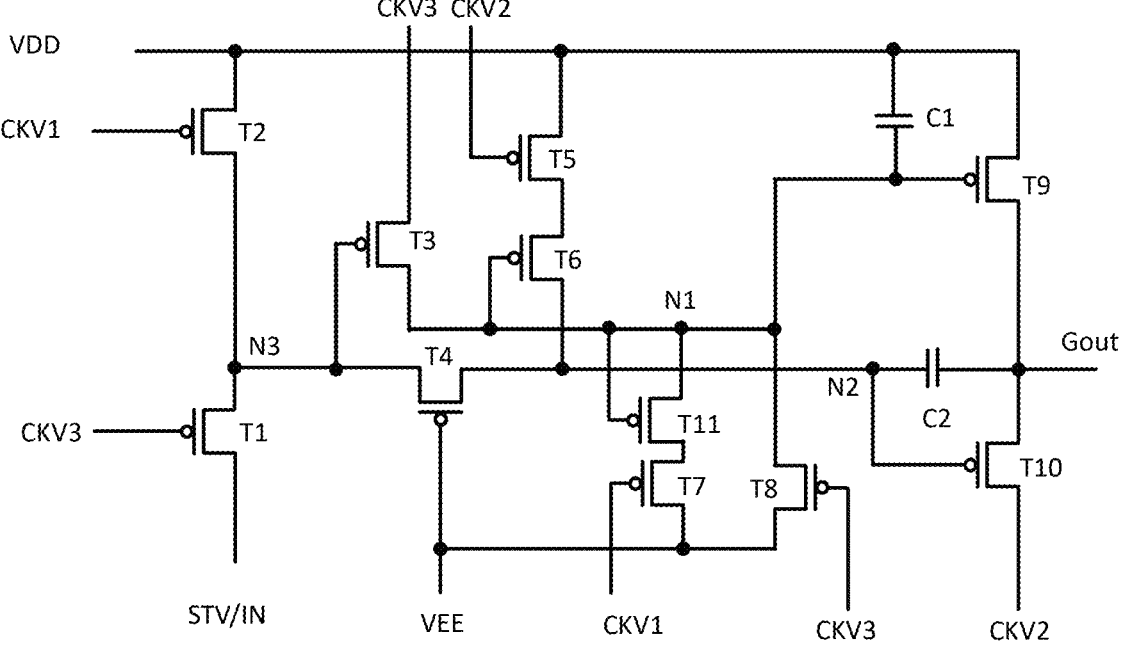
FIG. 12 shows a circuit diagram of a shift register unit of a second embodiment of the present disclosure.

Through careful and in-depth research, the inventor of the application has provided a solution to the problems existing in the prior art, that is, the shift register circuit in FIG. 1. As shown in FIGS. 2 to 4 and FIG. 12, FIG. 2 shows a schematic diagram of the display panel of the present disclosure; FIG. 3 shows a cascade schematic diagram of the scan driving circuit of the present disclosure; FIG. 4 shows a circuit diagram of a shift register unit of a first embodiment of the present disclosure; FIG. 12 shows a circuit diagram of a shift register unit according to a second embodiment of the present disclosure. The present disclosure discloses a scan driving circuit 30 and a display panel 10. The scan driving circuit 30 includes multiple stages of shift register units and a timing controller 20. Each stage of shift register unit includes 10 or 11 transistors, 2 capacitors, a signal input terminal IN, a signal output terminal Gout and three timing control terminals. The timing controller 20 includes three timing control signal lines. By providing a new shift register unit circuit and increasing the number of components, the scan driving circuit and display panel of the present disclosure enhance the stability of the output signal waveform of the shift register unit, enhance the tolerance of the shift register unit circuit and increase the reliability of the display panel in the event of fluctuation in the manufacturing process of the display panel, noise from the power supply signal of the integrated circuit, and prolonged operation.

The specific embodiments of the present disclosure will be described in further detail below with reference to the accompanying drawings.

Figure 2:
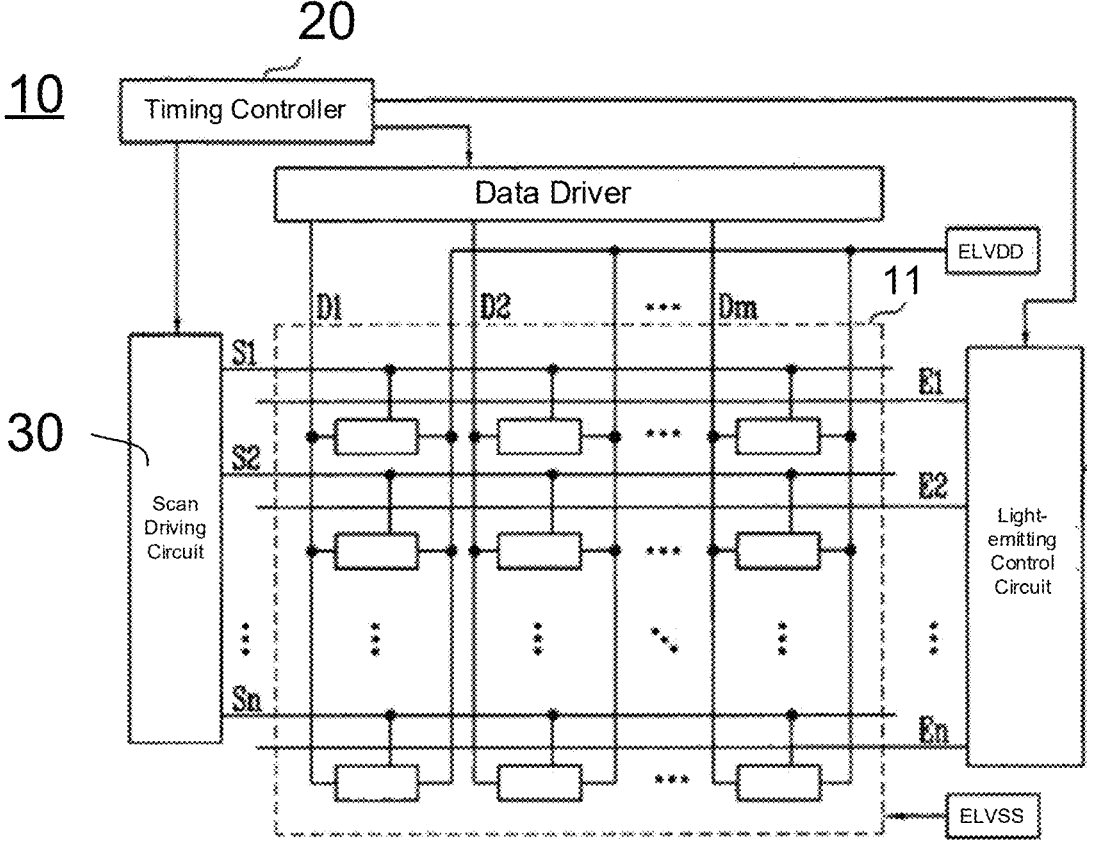
FIG. 2 shows a schematic diagram of the display panel of the present disclosure.

As shown in FIG. 2, the present disclosure provides a display panel 10. The display panel 10 includes a display area 11 and a non-display area. The scan driving circuit 30, the data driver and the light-emitting driving circuit are located in the non-display area of the display panel 10. The display area 11 includes light-emitting pixels arranged in an array and a pixel circuit. The light-emitting pixel emits light by the scan driving circuit 30, the data driver, the light-emitting driving circuit and the pixel circuit.

As shown in FIGS. 2 and 3, the present disclosure also provides a scan driving circuit 30, which includes multiple stages of shift register units and a timing controller 20.

In some embodiments, as shown in FIGS. 4 and 12, the shift register unit includes 10 or 11 transistors, 2 capacitors, a signal input terminal IN, a signal output terminal Gout, a first timing control terminal c1, a second timing control terminal c2 and a third timing control terminal c3. Each stage of the shift register unit outputs a scan signal, which is input to a row of pixel circuits in the display area 11 of the display panel 10 to drive the row of pixels to emit light. The previous stage of shift register unit simultaneously outputs the scan signal to the signal input terminal IN of the next stage of shift register unit as a start signal. The last shift register unit outputs a scan signal that is input only to that row of pixel circuit because there is no next stage.

Specifically, in FIG. 3, five cascaded shift register units are shown as an example. The start pulse signal STV is input to the signal input terminal IN1 of the first-stage shift register unit S1 as the input signal. The signal output terminal Gout1 of the first-stage shift register unit S1 outputs the scan signal as the input signal of the second-stage shift register unit S2. The signal output terminal Gout1 of the first-stage shift register unit S1 is connected to the signal input terminal IN2 of the second-stage shift register unit S2. The signal output terminal Gout2 of the second-stage shift register unit S2 outputs the scan signal as the input signal of the third-stage shift register unit S3. The signal output terminal Gout2 of the second-stage shift register unit S2 is connected to the signal input terminal IN3 of the third-stage shift register unit S3. The signal output terminal Gout3 of the third-stage shift register unit S3 outputs the scan signal as the input signal of the fourth-stage shift register unit S4. The signal output terminal Gout3 of the third-stage shift register unit S3 is connected to the signal input terminal IN4 of the fourth-stage shift register unit S4. The signal output terminal Gout4 of the fourth-stage shift register unit S4 outputs the scan signal as the input signal of the fifth-stage shift register unit S5. The signal output terminal Gout4 of the fourth-stage shift register unit S4 is connected to the signal input terminal IN5 of the fifth-stage shift register unit S5. The subsequent stages of shift register units repeat this to form the scan driving circuit 30.

In some embodiments, as shown in FIG. 3, the timing controller 20 includes a first timing control signal line CKV1, a second timing control signal line CKV2, and a third timing control signal line CKV3. The first timing control signal line CKV1 is configured to output a first timing control signal. The second timing control signal line CKV2 is configured to output a second timing control signal. The third timing control signal line CKV3 is configured to output a third timing control signal. The first timing control signal, the second timing control signal and the third timing control signal are square wave signals with the same output frequency and continuous low potential occupying ⅓ of the period.

In some embodiments, continuing to refer to FIG. 3, further, in the (3N-2)th stage of shift register unit, the first timing control terminal c1 is connected to the first timing control signal line CKV1 for receiving the first timing control signal. The second timing control terminal c2 is connected to the second timing control signal line CKV2 for receiving the second timing control signal. The third timing control terminal c3 is connected to the third timing control signal line CKV3 for receiving the third timing control signal. N is a positive integer. In the (3N-1)th stage of shift register unit, the first timing control terminal c1 is connected to the third timing control signal line CKV3 for receiving the third timing control signal. The second timing control terminal c2 is connected to the first timing control signal line CKV1 for receiving the first timing control signal. The third timing control terminal c3 is connected to the second timing control signal line CKV2 for receiving the second timing control signal. N is a positive integer. In the 3N-th stage of shift register unit, the first timing control terminal c1 is connected to the second timing control signal line CKV2 for receiving the second timing control signal. The second timing control terminal c2 is connected to the third timing control signal line CKV3 for receiving the third timing control signal. The third timing control terminal c3 is connected to the first timing control signal line CKV1 for receiving the first timing control signal. N is a positive integer. Each stage of the shift register unit of the scan driving circuit 30 receives three types of timing control signals according to the above rules.

Figure 5:
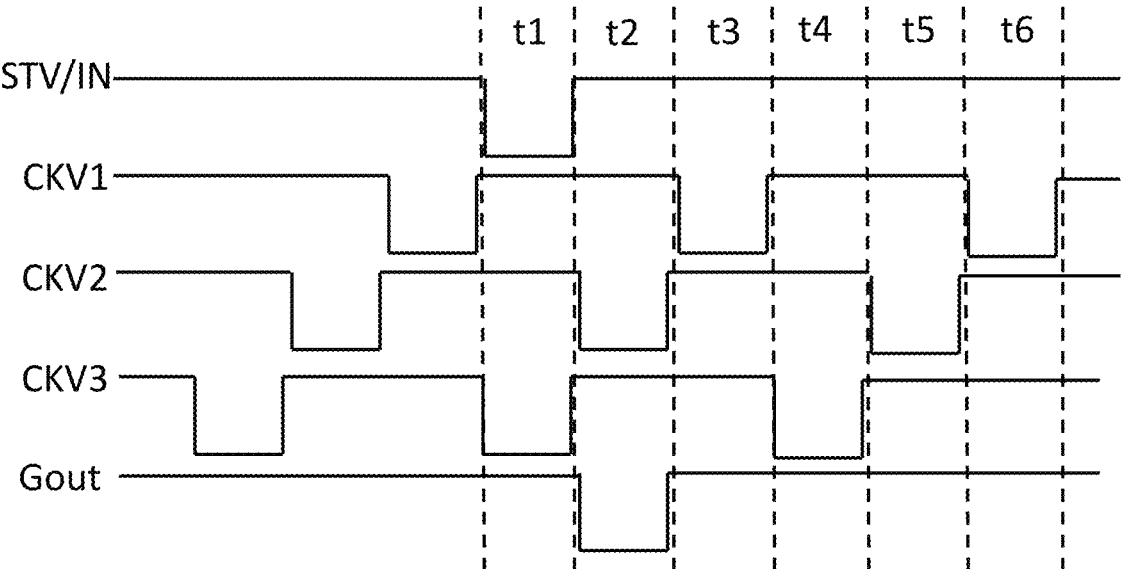
FIG. 5 shows a waveform diagram when the shift register unit shown in FIG. 4 is operating.
Figure 6:
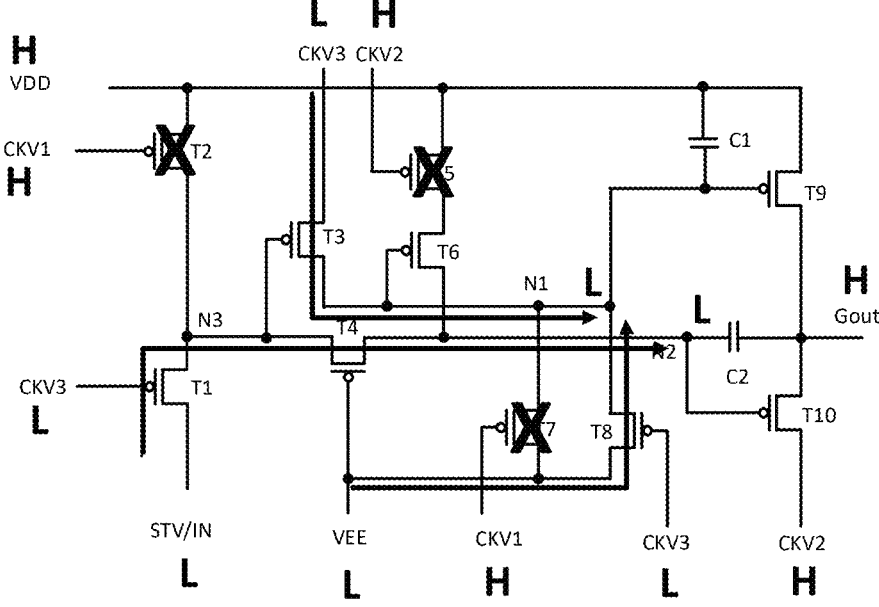
FIG. 6 shows a schematic diagram of the conduction state of the shift register unit in the t1 stage in FIG. 5.
Figure 7:
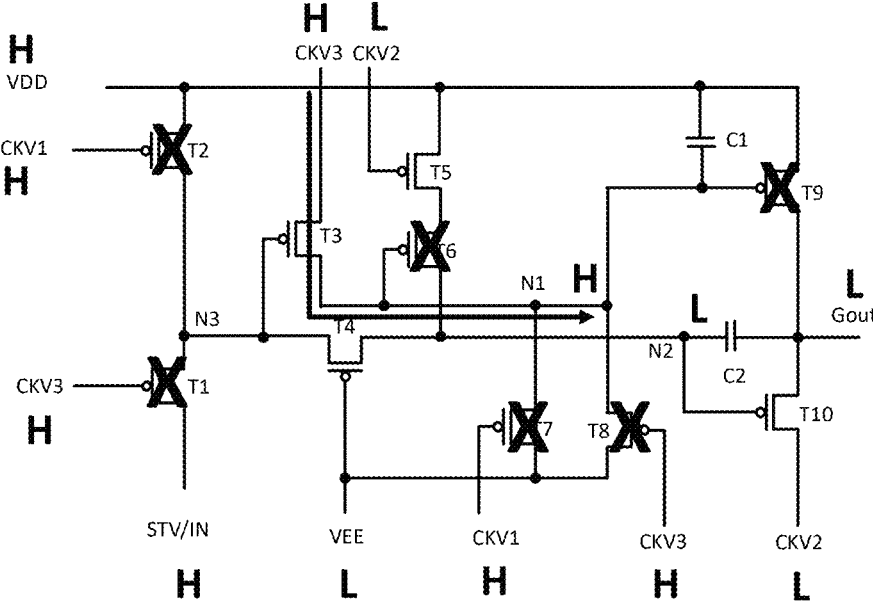
FIG. 7 shows a schematic diagram of the conduction state of the shift register unit in stage t2 in FIG. 5.
Figure 8:
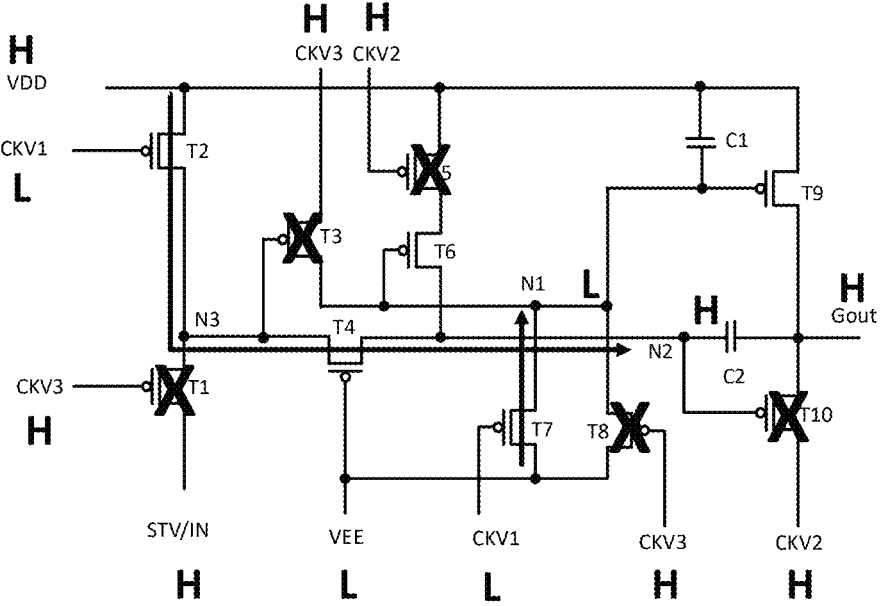
FIG. 8 shows a schematic diagram of the conduction state of the shift register unit in stage t3 in FIG. 5.
Figure 9:
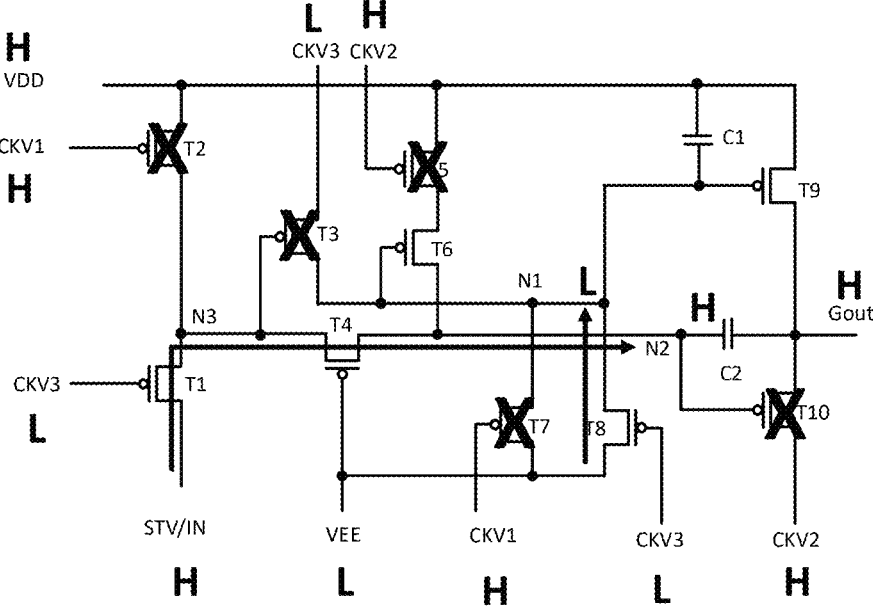
FIG. 9 shows a schematic diagram of the conduction state of the shift register unit in stage t4 in FIG. 5.
Figure 10:
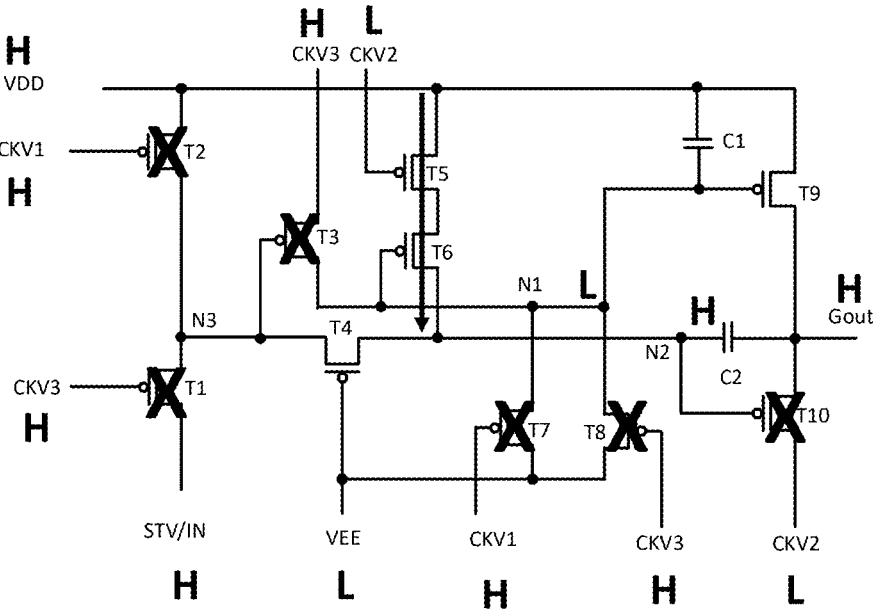
FIG. 10 shows a schematic diagram of the conduction state of the shift register unit in stage t5 in FIG. 5.
Figure 11:
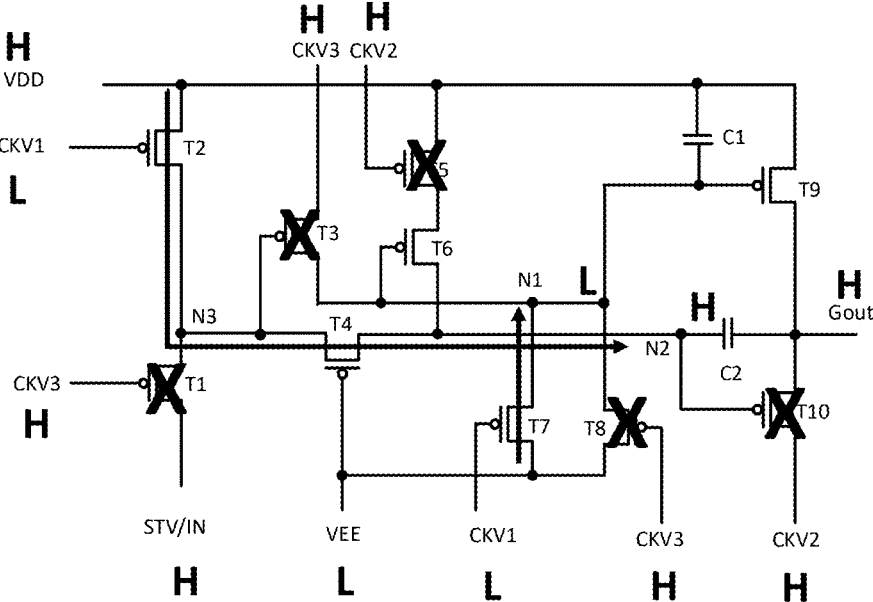
FIG. 11 shows a schematic diagram of the conduction state of the shift register unit in stage t6 in FIG. 5.

In a first embodiment of the present disclosure, with reference to FIGS. 4 to 11, FIG. 5 shows a waveform diagram of the shift register unit shown in FIG. 4 when it is operating; FIG. 6 shows a schematic diagram of the conduction state of the shift register unit in the t1 stage in FIG. 5; FIG. 7 shows a schematic diagram of the conduction state of the shift register unit in the t2 stage in FIG. 5; FIG. 8 shows a schematic diagram of the conduction state of the shift register unit in the t3 stage in FIG. 5; FIG. 9 shows a schematic diagram of the conduction state of the shift register unit in the t4 stage in FIG. 5; FIG. 10 shows a schematic diagram of the conduction state of the shift register unit in the t5 stage in FIG. 5; FIG. 11 shows a schematic diagram of the conduction state diagram of the shift register unit in the t6 stage in FIG. 5.

As shown in FIG. 5, the shift register unit of the first embodiment of the present disclosure includes first to tenth transistors T1 to T10, a first capacitor C1 and a second capacitor C2, a signal input terminal IN, a signal output terminal Gout, a first timing control terminal c1 and a second timing control terminal c2. The first electrode of the first transistor T1 is connected to the third node N3, the second electrode is connected to the signal input terminal IN, and the gate electrode is connected to the third timing control terminal c3. The first electrode of the second transistor T2 is connected to the first power supply VDD, the second electrode is connected to the third node N3, and the gate electrode is connected to the first timing control terminal c1. The first electrode of the third transistor T3 is connected to the third timing control terminal c3, the second electrode is connected to the first node N1, and the gate electrode is connected to the third node N3. The first electrode of the fourth transistor T4 is connected to the third node N3, the second electrode is connected to the second node N2, and the gate electrode is connected to the second power supply VEE. The first electrode of the fifth transistor T5 is connected to the first power supply VDD, and the gate electrode is connected to the second timing control terminal c2. The first electrode of the sixth transistor T6 is connected to the second electrode of the fifth transistor T5, the second electrode is connected to the second node N2, and the gate electrode is connected to the first node N1. The second electrode of the seventh transistor T7 is connected to the second power supply VEE, and the gate electrode is connected to the first timing control terminal c1. The first electrode of the eighth transistor T8 is connected to the first node N1, the second electrode is connected to the second power supply VEE, and the gate electrode is connected to the third timing control terminal c3. The first electrode of the ninth transistor T9 is connected to the first power supply VDD, the second electrode is connected to the signal output terminal Gout, and the gate electrode is connected to the first node N1. The first electrode of the tenth transistor T10 is connected to the signal output terminal Gout, the second electrode is connected to the second timing control terminal c2, and the gate electrode is connected to the second node N2. The first electrode of the first capacitor C1 is connected to the first power supply VDD, and the second electrode is connected to the first node N1. The first electrode of the second capacitor C2 is connected to the second node N2, and the second electrode is connected to the signal output terminal Gout. Particularly, in this embodiment, the first electrode of the seventh transistor T7 is connected to the first node N1. The first power supply VDD provides a positive voltage signal, and the second power supply VEE provides a negative voltage signal.

In this embodiment, the first to tenth transistors T1 to T10 are all P-type MOS transistors. The control terminal of the PMOS transistor is the gate electrode, its first electrode is the source electrode, and its second electrode is the drain electrode, or its first electrode is the drain electrode and its second electrode is the source electrode. The on-state potential of the PMOS transistor is low, and the off-state potential is high. In some other embodiments, those skilled in the art can easily change the shift register unit provided by the present disclosure to be all N-type MOS transistors or CMOS transistors.

In this embodiment, referring to FIG. 5, the waveform diagram shown in FIG. 5 includes six processes: t1 to t6. During these six processes, the output signal of the signal output terminal Gout of the above-mentioned shift register unit completes a process from setting to resetting. It should be noted that, for the convenience of understanding, the high-potential signal is represented by "H", and the low-potential signal is represented by "L" in the drawings. The relationship between the input and output of the shift register unit in the above six processes is analyzed below based on the waveform diagram in FIG. 5 and the circuit diagram in FIG. 4:

In the process of t1, referring to FIGS. 5 and 6, the start pulse signal STV or the signal input terminal IN inputs a low potential, the first timing control signal line CKV1 inputs a high potential, the second timing control signal line CKV2 inputs a high potential, and the third timing control signal line CKV3 inputs a low potential. At this time, the second transistor T2 and the seventh transistor T7 are turned off by the high potential input by the first timing control signal line CKV1. The first transistor T1 and the eighth transistor T8 are turned on by the low potential input by the third timing control signal line CKV3. The low potential of the start pulse signal STV or the signal input terminal IN is written into the third node N3, and the third transistor T3 is turned on. The fifth transistor T5 is turned off by the high potential input from the second timing control signal line CKV2. The fourth transistor T4 is turned on by the low potential of the second power supply VEE, and remains turned on during all processes. Furthermore, the low potential of the third timing control signal line CKV3 and the low potential of the second power supply VEE are written into the first node N1. The low potential of the start pulse signal STV or the low potential of the signal input terminal IN is written into the second node N2. As a result, both the ninth transistor T9 and the tenth transistor T10 are turned on. Finally, the signal output terminal Gout outputs the high potential of the first power supply VDD and the second timing control signal line CKV2.

During the t2 process, referring to FIGS. 5 and 7, the start pulse signal STV or the signal input terminal IN inputs a high potential, the first timing control signal line CKV1 inputs a high potential, the second timing control signal line CKV2 inputs a low potential, and the third timing control signal line CKV3 inputs a high potential. At this time, the first transistor T1, the second transistor T2, the seventh transistor T7 and the eighth transistor T8 are turned off by the high potential input from the first timing control signal line CKV1 and the third timing control signal line CKV3. The third node N3 maintains the low potential of the previous process. The third transistor T3 is turned on. The high potential of the third timing control signal line CKV3 is written into the first node N1. The sixth transistor T6 is turned off. The fourth transistor T4 is turned on by the low potential of the second power supply VEE. The low potential of the third node N3 is written into the second node N2. As a result, the ninth transistor T9 is turned off by the high potential of the first node N1, and the tenth transistor T10 is turned on by the low potential of the second node N2. Finally, the signal output terminal Gout outputs the low potential of the second timing control signal line CKV2.

During the t3 process, referring to FIGS. 5 and 8, the start pulse signal STV or the signal input terminal IN inputs a high potential, the first timing control signal line CKV1 inputs a low potential, the second timing control signal line CKV2 inputs a high potential, and the third timing control signal line CKV3 inputs a high potential. At this time, the first transistor T1, the third transistor T3, the fifth transistor T5 and the eighth transistor T8 are turned off by the high potential input from the second timing control signal line CKV2 and the third timing control signal line CKV3. The second transistor T2, the fourth transistor T4 and the seventh transistor T7 are turned on by the low potential of the first timing control signal line CKV1 and the low potential of the second power supply VEE. Furthermore, the low potential of the second power supply VEE is written into the first node N1. The high potential of the first power supply VDD is written into the second node N2. As a result, the ninth transistor T9 is turned on by the low potential of the first node N1, and the tenth transistor T10 is turned off by the high potential of the second node N2. Finally, the signal output terminal Gout outputs the high potential of the first power supply VDD.

During the t4 process, referring to FIGS. 5 and 9, the start pulse signal STV or the signal input terminal IN inputs a high potential, the first timing control signal line CKV1 inputs a high potential, the second timing control signal line CKV2 inputs a high potential, and the third timing control signal line CKV3 inputs a low potential. At this time, the second transistor T2, the fifth transistor T5 and the seventh transistor T7 are turned off by the high potential input from the first timing control signal line CKV1 and the second timing control signal line CKV2. The first transistor T1, the fourth transistor T4 and the eighth transistor T8 are turned on by the low potential input from the third timing control signal line CKV3 and the second power supply VEE. Furthermore, the third node N3 is written to a high potential by the start pulse signal STV or the signal input terminal IN, and the third transistor T3 is turned off. Furthermore, the low potential of the second power supply VEE is written into the first node N1. The high potential of the third node N3 is written into the second node N2. As a result, the ninth transistor T9 is turned on by the low potential of the first node N1, and the tenth transistor T10 is turned off by the high potential of the second node N2. Finally, the signal output terminal Gout outputs the high potential of the first power supply VDD.

During the t5 process, referring to FIGS. 5 and 10, the start pulse signal STV or the signal input terminal IN inputs a high potential, the first timing control signal line CKV1 inputs a high potential, the second timing control signal line CKV2 inputs a low potential, and the third timing control signal line CKV3 inputs a high potential. At this time, the first transistor T1, the second transistor T2, the seventh transistor T7 and the eighth transistor T8 are turned off by the high potential input from the first timing control signal line CKV1 and the third timing control signal line CKV3. The third node N3 maintains the high potential of the previous process, and the third transistor T3 is turned off. The fifth transistor T5 is input with a low potential by the second timing control signal line CKV2. The first node N1 maintains the low potential of the previous process, and the sixth transistor T6 is turned on. The high potential of the first power supply VDD is written into the second node N2. As a result, the ninth transistor T9 is turned on by the low potential of the first node N1, and the tenth transistor T10 is turned off by the high potential of the second node N2. Finally, the signal output terminal Gout outputs the high potential of the first power supply VDD.

During the t6 process, referring to FIGS. 5 and 11, the start pulse signal STV or the signal input terminal IN inputs a high potential, the first timing control signal line CKV1 inputs a low potential, the second timing control signal line CKV2 inputs a high potential, and the third timing control signal line CKV3 inputs a high potential. At this time, the first transistor T1 and the eighth transistor T8 are turned off by the high potential input from the third timing control signal line CKV3. The second transistor T2 and the seventh transistor T7 are turned on by the low potential input from the first timing control signal line CKV1. The high potential of the first power supply VDD is written into the third node N3, and the third transistor T3 is turned off. The fifth transistor T5 is turned off by the high potential input from the second timing control signal line CKV2. The fourth transistor T4 is turned on by the low potential of the second power supply VEE. Furthermore, the low potential of the second power supply VEE is written into the first node N1. The high potential of the first power supply VDD is written into the second node N2. As a result, the ninth transistor T9 is turned on by the low potential of the first node N1, and the tenth transistor T10 is turned off by the high potential of the second node N2. Finally, the signal output terminal Gout outputs the high potential of the first power supply VDD.

The operation steps of the shift register unit after t6 repeat the t4 process to the t4 process until the next frame image begins to display, the starting pulse signal STV or the signal input terminal IN inputs a low level, and re-enters the next round of t1 process.

In this embodiment, the relationship between the input and output of the shift register unit is: if the start pulse signal STV or the signal input terminal IN is at low potential in a certain process, then under the action of the first timing control signal line CKV1, the second timing control signal line CKV2 and the third timing control signal line CKV3, the signal output terminal Gout also outputs a low level in the next process. In other processes, the start pulse signal STV or the signal input terminal IN and the signal output terminal Gout remain at a high potential, until the start pulse signal STV or the signal input terminal IN inputs a low potential again, and the signal output terminal Gout outputs a low potential again. It is equivalent to that the shift register unit delays the low-potential signal from the start pulse signal STV or the signal input terminal IN and then output it from the signal output terminal Gout.

In this embodiment, compared with the prior art, the 10T2C circuit of the shift register unit adds two transistors, changes some wiring settings, and cancels the N2' node in the circuit of prior art, so that the high level at the node N1' is maintained by the voltage power supply to turn off the tenth transistor T10 when the output terminal VOUT outputs a high level, which avoids the possibility of potential drift and can effectively provide stable output signal waveform under the conditions of display panel process fluctuations, integrated circuit power signal noise, and long-term operation, and improves the tolerance of the shift register unit circuit and increases the reliability of the display panel.

In the second embodiment of the present disclosure, referring to FIGS. 2, 3 and 12, the shift register unit of this embodiment includes first to eleventh transistors T1 to T11, a first capacitor C1 and a second capacitor C2, a signal input terminal IN, a signal output terminal Gout, a first timing control terminal c1 and a second timing control terminal c2. In particular, the first electrode of the eleventh transistor T11 is connected to the first node N1, the second electrode is connected to the first electrode of the seventh transistor T7, and the gate electrode is connected to the first node N1. The connection methods of other components are the same as those in the first embodiment of the present disclosure.

In this embodiment, the working process of the above-mentioned shift register unit is also divided into six processes. During these six processes, the output signal of the signal output terminal Gout of the above-mentioned shift register unit completes a process from setting to resetting. The output result of this embodiment is the same as that of the first embodiment. In particular, in the third process of this embodiment, the first node N1 maintains a high potential at the previous moment, the ninth transistor T9 is in a turned-off state, and the signal output terminal Gout maintains a high potential at the previous moment.

In this embodiment, the relationship between the input and output of the shift register unit is the same as that in the first embodiment, which is equivalent to that the shift register unit delays the low potential signal from the start pulse signal STV or the signal input terminal IN and then outputs it from the signal output terminal Gout.

In this embodiment, compared with the prior art, the 11T2C circuit of the shift register unit adds three transistors and changes some wiring settings. The technical effect achieved is also the same as that of the first embodiment, and will not be repeated here.

Based on the same inventive concept, an embodiment of the present disclosure also provides a display device, including the above-mentioned display panel 10 provided by the embodiment of the present disclosure. The display device can be: a mobile phone, a tablet computer, a television, a monitor, a notebook computer, a digital photo frame, a navigator, or any other product or component with a display function. For the implementation of the display device, reference may be made to the embodiment of the display panel 10 described above, and repeated details will not be described again.

The scan driving circuit and display panel of the present disclosure provide a new shift register unit circuit and increase the number of components, so that the stability of the output signal waveform of the shift register unit can be strengthened under the conditions of display panel process fluctuations, integrated circuit power signal noise, and long-term operation, the tolerance of the shift register unit circuit is improved and the reliability of the display panel is increased.

The above content is a further detailed description of the present disclosure in combination with specific embodiments, and it cannot be concluded that the specific implementation of the present disclosure is limited to these descriptions. For those of ordinary skill in the technical field to which the present disclosure belongs, several simple deductions or substitutions can be made without departing from the concept of the present disclosure, and all of them should be regarded as belonging to the protection scope of the present disclosure.

What is claimed is:

1. A scan driving circuit, comprising multiple stages of shift register units, wherein each of the shift register units comprises:

a first transistor, wherein a first electrode of the first transistor is connected to a third node, a second electrode of the first transistor is connected to a signal input terminal, and a gate electrode of the first transistor is connected to a third timing control terminal;

a second transistor, wherein a first electrode of the second transistor is connected to a first power supply, a second electrode of the second transistor is connected to the third node, and a gate electrode of the second transistor is connected to a first timing control terminal;

a third transistor, wherein a first electrode of the third transistor is connected to the third timing control terminal, a second electrode of the third transistor is connected to a first node, and a gate electrode of the third transistor is connected to the third node;

a fourth transistor, wherein a first electrode of the fourth transistor is connected to the third node, a second electrode of the fourth transistor is connected to a second node, and a gate electrode of the fourth transistor is connected to a second power supply;

a fifth transistor, wherein a first electrode of the fifth transistor is connected to the first power supply, and a gate electrode of the fifth transistor is connected to a second timing control terminal;

a sixth transistor, wherein a first electrode of the sixth transistor is connected to the second electrode of the fifth transistor, a second electrode of the sixth transistor is connected to the second node, and a gate electrode of the sixth transistor is connected to the first node;

a seventh transistor, wherein a second electrode of the seventh transistor is connected to the second power supply, and a gate electrode of the seventh transistor is connected to the first timing control terminal;

an eighth transistor, wherein a first electrode of the eighth transistor is connected to the first node, a second electrode of the eighth transistor is connected to the second power supply, and a gate electrode of the eighth transistor is connected to the third timing control terminal;

a ninth transistor, wherein a first electrode of the ninth transistor is connected to the first power supply, a second electrode of the ninth transistor is connected to a signal output terminal, and a gate electrode of the ninth transistor is connected to the first node;

a tenth transistor, wherein a first electrode of the tenth transistor is connected to the signal output terminal, a second electrode of the tenth transistor is connected to the second timing control terminal, and a gate electrode of the tenth transistor is connected to the second node;

a first capacitor, wherein a first electrode of the first capacitor is connected to the first power supply, and a second electrode of the first capacitor is connected to the first node; and a second capacitor, wherein a first electrode of the second capacitor is connected to the second node, and a second electrode of the second capacitor is connected to the signal output terminal.

2. The scan driving circuit according to claim 1, wherein the first electrode of the seventh transistor is connected to the first node.

3. The scan driving circuit according to claim 1, wherein the shift register unit further comprises:

an eleventh transistor, wherein a first electrode of the eleventh transistor is connected to the first node, a second electrode of the eleventh transistor is connected to the first electrode of the seventh transistor, and a gate electrode of the eleventh transistor is connected to the first node.

4. The scan driving circuit according to claim 3, wherein the first transistor to the eleventh transistor are all P-type MOS transistors.

5. The scan driving circuit according to claim 1, further comprising a timing controller, wherein the timing controller comprises a first timing control signal line, a second timing control signal line and a third timing control signal line.

6. The scan driving circuit according to claim 5, wherein the first timing control signal line is configured to output a first timing control signal; the second timing control signal line is configured to output a second timing control signal; and the third timing control signal line is configured to output a third timing control signal.

7. The scan driving circuit according to claim 6, wherein the first timing control signal, the second timing control signal and the third timing control signal are square wave signals with same output frequency and a continuous low potential occupying ⅓ of a period.

8. The scan driving circuit according to claim 6, wherein the shift register unit is configured to perform a delay processing on a signal received from the signal input terminal under control of the first timing control signal, the second timing control signal and the third timing control signal, and a processed signal is output by the signal output terminal.

9. The scan driving circuit according to claim 6, wherein in a (3N-2)-th stage shift register unit, the first timing control terminal is connected to the first timing control signal line, the second timing control terminal is connected to the second timing control signal line, and the third timing control terminal is connected to the third timing control signal line, wherein N is a positive integer.

10. The scan driving circuit according to claim 9, wherein in a (3N-1)-th stage shift register unit, the first timing control terminal is connected to the third timing control signal line, the second timing control terminal is connected to the first timing control signal line, and the third timing control terminal is connected to the second timing control signal line, wherein N is a positive integer.

11. The scan driving circuit according to claim 10, wherein in a 3N-th stage shift register unit, the first timing control terminal is connected to the second timing control signal line, the second timing control terminal is connected to the third timing control signal line, and the third timing control terminal is connected to the first timing control signal line, wherein N is a positive integer.

12. The scan driving circuit according to claim 5, wherein the shift register unit at a previous stage outputs a scan signal to the shift register unit at a next stage, and the shift register unit at a last stage outputs a scan signal.

13. A display panel, comprising a scan driving circuit, wherein the scan driving circuit comprises multiple stages of shift register units, and each of the shift register units comprises:

a first transistor, wherein a first electrode of the first transistor is connected to a third node, a second electrode of the first transistor is connected to a signal input terminal, and a gate electrode of the first transistor is connected to a third timing control terminal;

a second transistor, wherein a first electrode of the second transistor is connected to a first power supply, a second electrode of the second transistor is connected to the third node, and a gate electrode of the second transistor is connected to a first timing control terminal;

a third transistor, wherein a first electrode of the third transistor is connected to the third timing control terminal, a second electrode of the third transistor is connected to a first node, and a gate electrode of the third transistor is connected to the third node;

a fourth transistor, wherein a first electrode of the fourth transistor is connected to the third node, a second electrode of the fourth transistor is connected to a second node, and a gate electrode of the fourth transistor is connected to a second power supply;

a fifth transistor, wherein a first electrode of the fifth transistor is connected to the first power supply, and a gate electrode of the fifth transistor is connected to a second timing control terminal;

a sixth transistor, wherein a first electrode of the sixth transistor is connected to the second electrode of the fifth transistor, a second electrode of the sixth transistor is connected to the second node, and a gate electrode of the sixth transistor is connected to the first node;

a seventh transistor, wherein a second electrode of the seventh transistor is connected to the second power supply, and a gate electrode of the seventh transistor is connected to the first timing control terminal;

an eighth transistor, wherein a first electrode of the eighth transistor is connected to the first node, a second electrode of the eighth transistor is connected to the second power supply, and a gate electrode of the eighth transistor is connected to the third timing control terminal;

a ninth transistor, wherein a first electrode of the ninth transistor is connected to the first power supply, a second electrode of the ninth transistor is connected to a signal output terminal, and a gate electrode of the ninth transistor is connected to the first node;

a tenth transistor, wherein a first electrode of the tenth transistor is connected to the signal output terminal, a second electrode of the tenth transistor is connected to the second timing control terminal, and a gate electrode of the tenth transistor is connected to the second node;

a first capacitor, wherein a first electrode of the first capacitor is connected to the first power supply, and a second electrode of the first capacitor is connected to the first node; and a second capacitor, wherein a first electrode of the second capacitor is connected to the second node, and a second electrode of the second capacitor is connected to the signal output terminal.

14. The display panel according to claim 13, wherein the first electrode of the seventh transistor is connected to the first node.

15. The display panel according to claim 13, wherein the shift register unit further comprises:

an eleventh transistor, wherein a first electrode of the eleventh transistor is connected to the first node, a second electrode of the eleventh transistor is connected to the first electrode of the seventh transistor, and a gate electrode of the eleventh transistor is connected to the first node.

16. The display panel according to claim 13, further comprising a timing controller, wherein the timing controller comprises a first timing control signal line, a second timing control signal line and a third timing control signal line.

17. The display panel according to claim 16, wherein the first timing control signal line is configured to output a first timing control signal; the second timing control signal line is configured to output a second timing control signal; and the third timing control signal line is configured to output a third timing control signal.

18. The display panel according to claim 17, wherein the first timing control signal, the second timing control signal and the third timing control signal are square wave signals with same output frequency and a continuous low potential occupying ⅓ of a period.

19. The display panel according to claim 17, wherein the shift register unit is configured to perform a delay processing on a signal received from the signal input terminal under control of the first timing control signal, the second timing control signal and the third timing control signal, and a processed signal is output by the signal output terminal.

20. The display panel according to claim 16, wherein the shift register unit at a previous stage outputs a scan signal to the shift register unit at a next stage, and the shift register unit at a last stage outputs a scan signal.

\* \* \* \* \*